(12) United States Patent
Ghinovker

(10) Patent No.: US 11,119,419 B2
(45) Date of Patent: Sep. 14, 2021

(54) MOIRÉ TARGET AND METHOD FOR USING THE SAME IN MEASURING MISREGISTRATION OF SEMICONDUCTOR DEVICES

(71) Applicant: KLA-TENCOR CORPORATION, Milpitas, CA (US)

(72) Inventor: Mark Ghinovker, Yoqneam Ilit (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/349,089

(22) PCT Filed: Apr. 10, 2019

(86) PCT No.: PCT/US2019/026686
§ 371 (c)(1),
(2) Date: May 10, 2019

(87) PCT Pub. No.: WO2020/159560
PCT Pub. Date: Aug. 6, 2020

(65) Prior Publication Data
US 2020/0249585 A1    Aug. 6, 2020

Related U.S. Application Data

(60) Provisional application No. 62/797,484, filed on Jan. 28, 2019.

(51) Int. Cl.
*H01L 21/66* (2006.01)
*G03F 7/20* (2006.01)
*G03F 9/00* (2006.01)

(52) U.S. Cl.
CPC ........ *G03F 7/70683* (2013.01); *G03F 9/7088* (2013.01); *H01L 22/12* (2013.01)

(58) Field of Classification Search
CPC ............. G03F 78/70683; G03F 9/7088; G03F 7/70683; H01L 22/12
USPC .................................................. 356/399–401
See application file for complete search history.

(56) References Cited

U.S. PATENT DOCUMENTS

| | | | |
|---|---|---|---|
| 7,230,705 B1 | 6/2007 | Yang et al. | |
| 7,440,105 B2* | 10/2008 | Adel ...................... | B82Y 10/00 257/797 |
| 7,772,710 B2 | 8/2010 | Silver et al. | |
| 7,826,095 B2 | 11/2010 | Wang et al. | |
| 9,007,584 B2* | 4/2015 | Li ........................ | G03F 7/70683 356/399 |
| 9,182,219 B1 | 11/2015 | Manassen et al. | |
| 2004/0061857 A1 | 4/2004 | Abdulhalim et al. | |
| 2016/0300767 A1* | 10/2016 | Ko .......................... | H01L 22/12 |

(Continued)

OTHER PUBLICATIONS

WIPO, ISR for PCT/US2019/026686, Oct. 25, 2019.

*Primary Examiner* — Hung Nguyen
(74) *Attorney, Agent, or Firm* — Hodgson Russ LLP

(57) ABSTRACT

A target for use in the optical measurement of misregistration in the manufacture of semiconductor devices, the target including a first periodic structure formed on a first layer of a semiconductor device and having a first pitch along an axis and a second periodic structure formed on a second layer of the semiconductor device and having a second pitch along the axis, different from the first pitch, the second periodic structure extending beyond the first periodic structure along the axis.

25 Claims, 7 Drawing Sheets

(56) References Cited

U.S. PATENT DOCUMENTS

2018/0188663 A1    7/2018  Levinski et al.
2020/0201193 A1    6/2020  Leshinsky-Altshuller et al.
2020/0266112 A1*   8/2020  Volkovich ......... H01L 21/67259

* cited by examiner

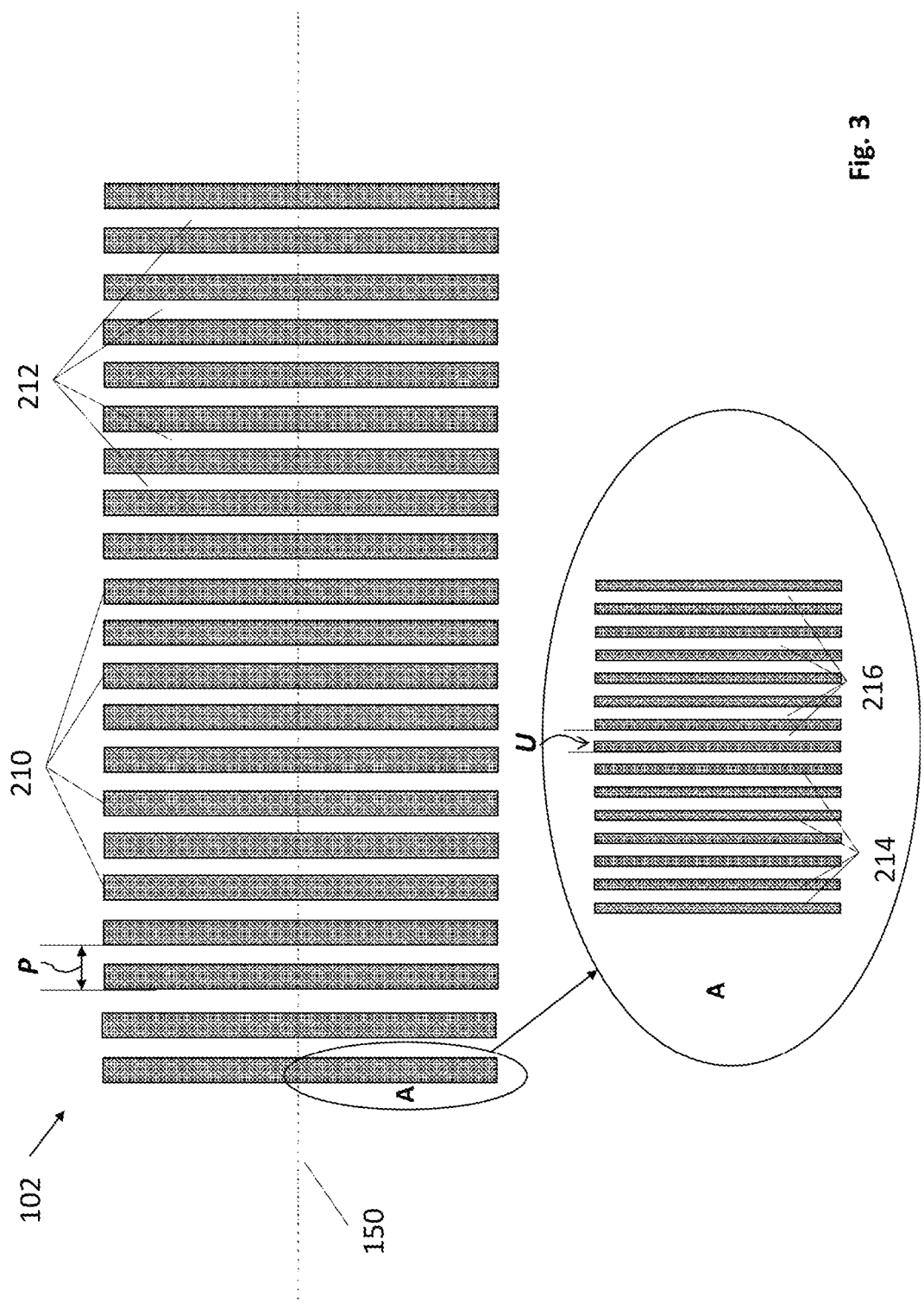

MOIRÉ TARGET AND METHOD FOR USING THE SAME IN MEASURING MISREGISTRATION OF SEMICONDUCTOR DEVICES

REFERENCE TO RELATED APPLICATIONS

Reference is hereby made to U.S. Provisional Patent Application Ser. No. 62/797,484, filed Jan. 28, 2019 and entitled MOIRÉ IN BOX OVERLAY MARK DESIGN FOR REAL ESTATE REDUCTION AND IN DIE MEASUREMENTS, the disclosure of which is hereby incorporated by reference and priority of which is hereby claimed.

Reference is also made to the following patent and patent application, which are related to the subject matter of the present application, the disclosures of which are hereby incorporated by reference:

Applicant's U.S. Patent Publication No. US2018/0188663, filed Feb. 24, 2017, published Jul. 5, 2018 and entitled DEVICE-LIKE METROLOGY TARGETS; and Applicant's U.S. Pat. No. 7,440,105 entitled CONTINUOUSLY VARYING OFFSET MARK AND METHODS OF DETERMINING OVERLAY and issued on Oct. 21, 2008.

FIELD OF THE INVENTION

The present invention relates to the measurement of misregistration in the manufacture of semiconductor devices and more particularly to targets useful in such measurement and methods for measurement of misregistration in the manufacture of semiconductor devices using such targets.

BACKGROUND OF THE INVENTION

Various types of targets are known in the art for the measurement of misregistration in the manufacture of semiconductor devices.

SUMMARY OF THE INVENTION

The present invention seeks to provide improved targets for the measurement of misregistration in the manufacture of semiconductor devices.

There is thus provided in accordance with a preferred embodiment of the present invention a target for use in the optical measurement of misregistration in the manufacture of semiconductor devices, the target including a first periodic structure formed on a first layer of a semiconductor device and having a first pitch along an axis and a second periodic structure formed on a second layer of the semiconductor device and having a second pitch along the axis, different from the first pitch, the second periodic structure extending beyond the first periodic structure along the axis.

Preferably, the first pitch and the second pitch are each smaller than 2000 nm. More preferably, the first pitch and the second pitch are each smaller than 650 nm.

In accordance with a preferred embodiment of the present invention the first and second pitches are such that when the target is illuminated by light of at least one wavelength there results a moiré pattern having a third pitch, the third pitch being larger than the at least one wavelength.

Preferably, the target has an area smaller than 50 µm×50 µm. More preferably, the target has an area smaller than 4 µm×4 µm. Even more preferably, the target has an area smaller than 2 µm×2 µm.

In accordance with a preferred embodiment of the present invention the target is rectangular in shape.

In accordance with a preferred embodiment of the present invention the second periodic structure extends beyond the first periodic structure in two opposite directions along the axis.

Preferably, the first periodic structure is defined by lines and spaces between the lines, the lines and the spaces between the lines each having a width equal to 50% of the first pitch. Alternatively, the first periodic structure is defined by lines and spaces between the lines, the lines each having a width of 10%-90% of the first pitch.

In accordance with a preferred embodiment of the present invention each of the lines is defined by a plurality of sub-lines and sub-spaces between the sub-lines. Additionally, the sub-lines and sub-spaces between the sub-lines have a pitch of approximately 12 nm-50 nm.

In accordance with a preferred embodiment of the present invention the second periodic structure is defined by lines and spaces between the lines, the lines and the spaces between the lines each having a width equal to 50% of the second pitch. Alternatively, the second periodic structure is defined by lines and spaces between the lines, the lines each having a width of 10%-90% of the second pitch.

Preferably, each of the lines of the second periodic structure is defined by a plurality of sub-lines and sub-spaces between the sub-lines. Additionally, the sub-lines and sub-spaces between the sub-lines of the second periodic structure have a pitch of approximately 12 nm-50 nm.

There is also provided in accordance with another preferred embodiment of the present invention a method of measuring misregistration in the manufacture of semiconductor devices, the method including providing a multilayered semiconductor device including at least a first layer and a second layer, wherein the device includes a target including a first periodic structure formed on the first layer and having a first pitch along an axis and a second periodic structure formed on the second layer and having a second pitch along the axis, different from the first pitch, the second periodic structure extending beyond the first periodic structure along the axis, illuminating the target with light of at least one wavelength, resulting in a moiré pattern characterized by a third pitch and performing analysis of the moiré pattern to ascertain misregistration of the first layer and the second layer along the axis.

Preferably, the target has an area smaller than 50 µm×50 µm. More preferably, the target has an area smaller than 4 µm×4 µm. Even more preferably, the target has an area smaller than 2 µm×2 µm.

In accordance with a preferred embodiment of the present invention the target is rectangular in shape.

In accordance with a preferred embodiment of the present invention the second periodic structure extends beyond the first periodic structure in two opposite directions along the axis.

Preferably, the first pitch and the second pitch are each smaller than the at least one wavelength. Additionally or alternatively, the third pitch is larger than the at least one wavelength. Alternatively, the first pitch and the second pitch are each larger than the at least one wavelength.

In accordance with a preferred embodiment of the present invention the first periodic structure is defined by lines and spaces between the lines, the lines and the spaces between the lines each having a width equal to 50% of the first pitch.

In accordance with a preferred embodiment of the present invention the first periodic structure is defined by lines and spaces between the lines, the lines each having a width of 10%-90% of the first pitch.

Preferably, each of the lines is defined by a plurality of sub-lines and sub-spaces between the sub-lines. Additionally, the sub-lines and sub-spaces between the sub-lines have a pitch of approximately 12 nm-50 nm.

In accordance with a preferred embodiment of the present invention the second periodic structure is defined by lines and spaces between the lines, the lines and the spaces between the lines of the second periodic structure each having a width equal to 50% of the second pitch.

In accordance with a preferred embodiment of the present invention the second periodic structure is defined by lines and spaces between the lines, the lines each having a width of 10%-90% of the first pitch.

Preferably, each of the lines of the second periodic structure is defined by a plurality of sub-lines and sub-spaces between the sub-lines. Additionally, the sub-lines and sub-spaces between the sub-lines have a pitch of approximately 12 nm-50 nm.

Preferably, the second periodic structure is characterized by a first center of symmetry, the illuminating of the target results in a signal from the target, the signal including a sinusoidal variation due to the moiré pattern, the sinusoidal variation characterized by a second center of symmetry and the analysis of the moiré pattern to ascertain the misregistration of the first layer and the second layer along the axis includes comparison of locations of the first center of symmetry and the second center of symmetry.

BRIEF DESCRIPTION OF THE DRAWINGS

The present invention will be understood and appreciated more fully from the following detailed description, taken in conjunction with the drawings in which:

FIG. 3 is a simplified top view illustration of a first target layer, forming part of the target of FIGS. 1A-2B;

DETAILED DESCRIPTION OF PREFERRED EMBODIMENTS

Reference is now made to FIGS. 1A-4, which illustrate a target for the measurement of misregistration in the manufacture of semiconductor devices, constructed and operative in accordance with a preferred embodiment of the present invention. It is appreciated that the target is formed of indicia formed on two patterned layers of a semiconductor device. The layers may be mutually adjacent but need not be, and may be separated by a height ranging from 100 nm to over 10 The upper layer is at least partially transparent to photons.

It is a requirement in the manufacture of most semiconductor devices having multiple patterned layers of conductors that the various layers be maintained in strict spatial registration, preferably to within a tolerance of less than 10 nm, and more preferably to within a tolerance of less than 3 nm.

The present invention seeks to provide a target, which enables misregistration of patterned layers of a semiconductor device to be optically measured to extremely high accuracy, preferably measuring misregistration in the range of 0-1000 nm and more preferably in the range of 0-50 nm.

Broadly stated, the target includes a first periodic structure formed on a first layer of a semiconductor device and having a first pitch along an axis and a second periodic structure formed on a second layer of the semiconductor device and having a second pitch along that axis, different from the first pitch, the second periodic structure including extended portions, which extend beyond the first periodic structure for approximately 500 nm in opposite directions along that axis. Additionally, the target preferably includes a pair of unpatterned zones on the second layer of approximately 500 nm in opposite directions along the axis beyond the ends of the second periodic structure. The extended portions of the second periodic structure together with the unpatterned zones make it possible to readily optically detect the ends of the second periodic structure, and thus its center of symmetry.

When suitably illuminated, the first and second periodic structures together form a moiré pattern, and the relative positions of the first and second periodic structures along the axis define the position of the moiré pattern along the axis. As is well known in the art, a small shift between the first and second periodic structures along the axis results in a significantly larger corresponding shift in the position of the moiré pattern relative to the second periodic structure along the axis. More specifically, the shift of the moiré pattern relative to the second periodic structure is larger than the shift between the first and second periodic structures by a factor F, as defined in equation 1:

$$F = \frac{Q}{|P-Q|} \quad \text{(Eq. 1)}$$

Wherein P is the pitch of the first periodic structure and Q is the pitch of the second periodic structure.

Figure 1A:
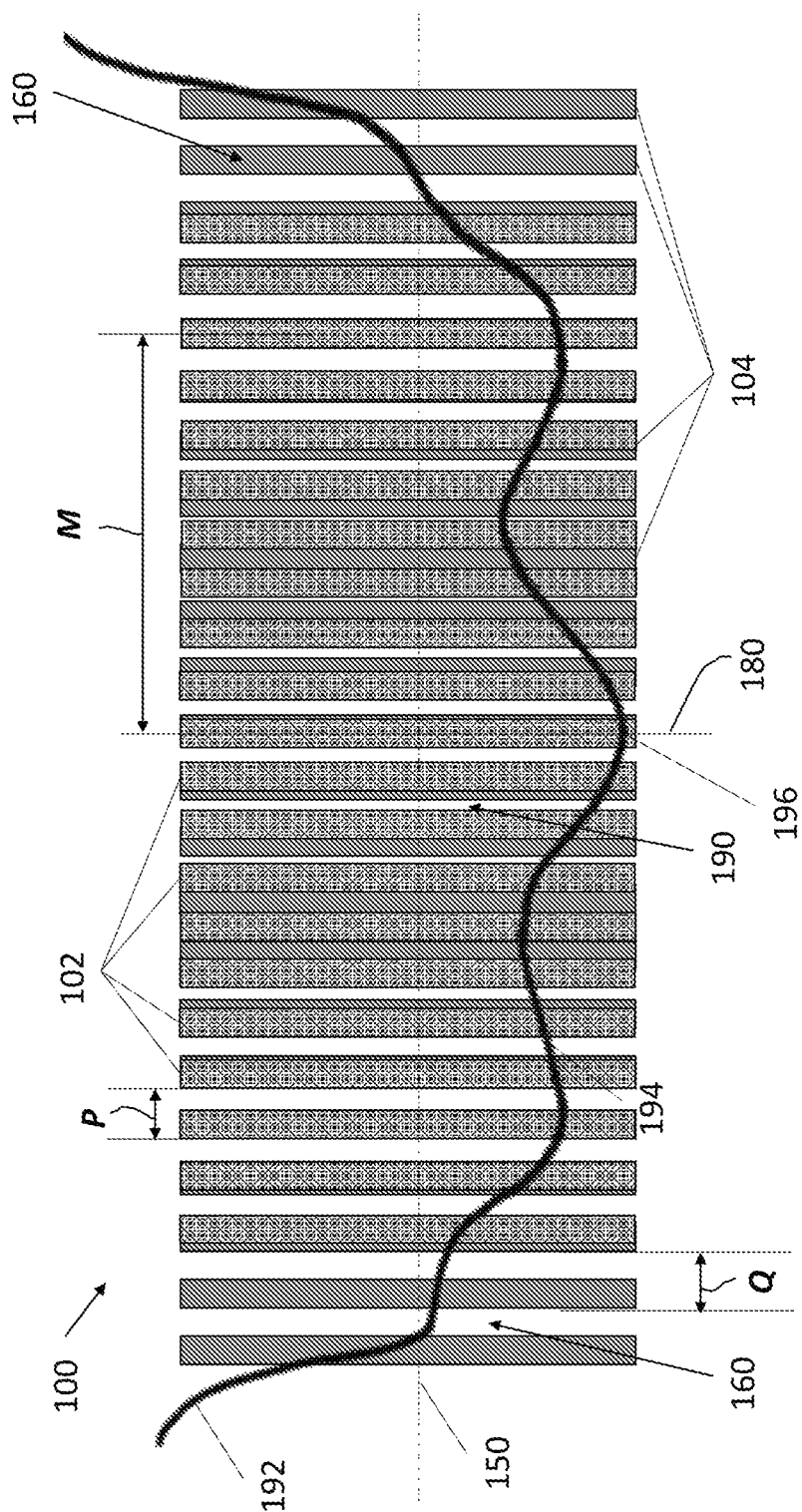
FIGS. 1A and 1B are simplified respective top view and sectional side view illustrations of a target for the measurement of misregistration in the manufacture of semiconductor devices, constructed and operative in accordance with a preferred embodiment of the present invention in a registration operative orientation.
Figure 1B:
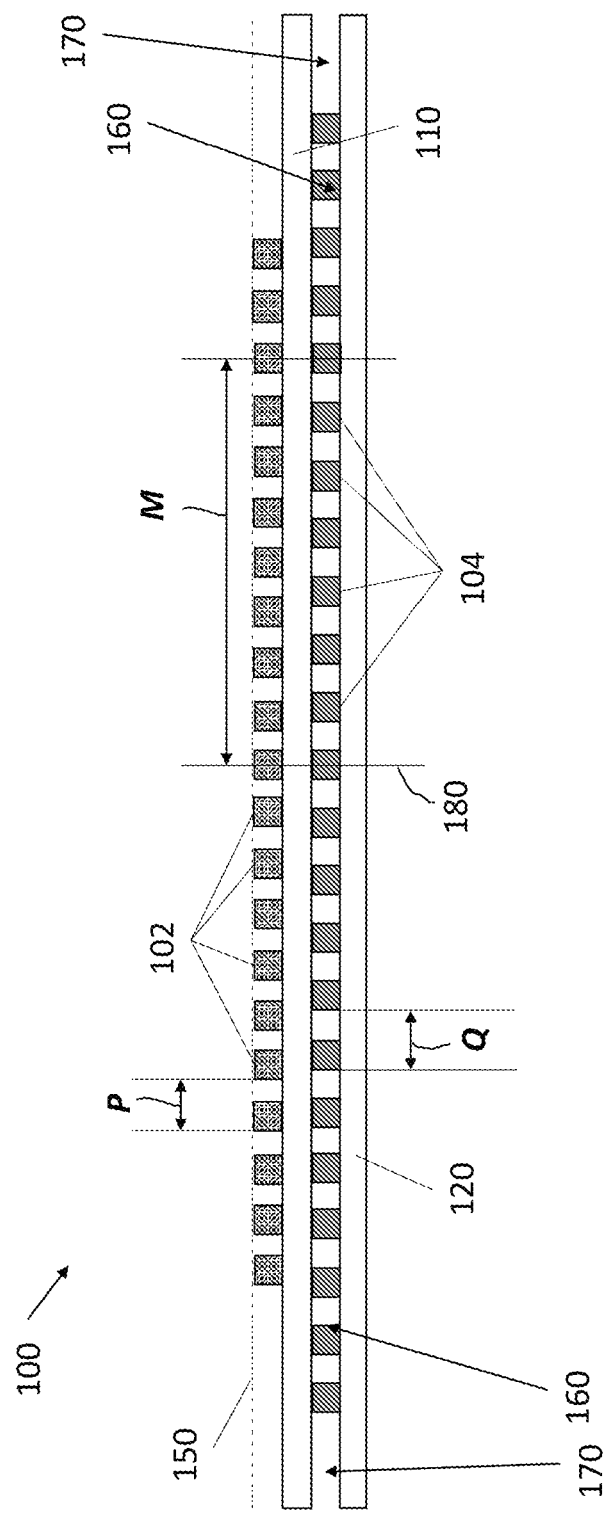

FIGS. 1A and 1B show a target 100 including a pair of mutually overlaid first and second periodic structures 102 and 104, shown here as first and second arrays of mutually parallel lines formed on first and second layers 110 and 120 respectively and arranged in registration along an axis 150. First and second periodic structures 102 and 104 have respective first and second pitches P and Q. Target 100 preferably has an area smaller than 50 µm×50 µm, and more preferably an area smaller than 4 µm×4 µm, and even more preferably an area smaller than 2 µm×2 µm. In a preferred embodiment of the present invention, target 100 is rectangular in shape. In another embodiment of the present invention, target 100 is square in shape.

Second periodic structure 104 includes extended portions 160 on second layer 120, which extend beyond first periodic structure 102 on first layer 110 for approximately 500 nm in opposite directions along axis 150. Additionally, the target preferably includes a pair of unpatterned zones 170 on second layer 120 of approximately 500 nm in opposite directions along axis 150 beyond the ends of second periodic structure 104. Extended portions 160 together with unpatterned zones 170 make it possible to readily optically detect the ends of second periodic structure 104, and thus a center of symmetry 180 of second periodic structure 104.

As described hereinabove, it is appreciated that first and second layers 110 and 120 may be mutually adjacent but need not be, and may be separated by a height ranging from 100 nm to over 10 µm. The upper layer, here shown as first layer 110, is at least partially transparent to photons. It is further appreciated that while FIGS. 1A-4 depict first periodic structure 102 arranged above second periodic structure 104, targets 100 and 200 may also be formed with second periodic structure 104 arranged above first periodic structure 102.

Together, when suitably illuminated, first periodic structure 102 and second periodic structure 104 form a moiré pattern 190 having a pitch M. As is well known in the art, pitch M of moiré pattern 190 is determined by pitches P and Q, as defined in equation 2:

$$M = \frac{P \times Q}{|P - Q|} \quad \text{(Eq. 2)}$$

Also shown in FIG. 1A is a representation of a signal 192 produced by an optical system used to image target 100 and moiré pattern 190 formed thereon. It is noted that moiré pattern 190 appears in signal 192 as a sinusoidal variation 194 having a center of symmetry 196. It is appreciated that signal 192, sinusoidal variation 194 and center of symmetry 196 are not drawn to scale.

Figure 2A:
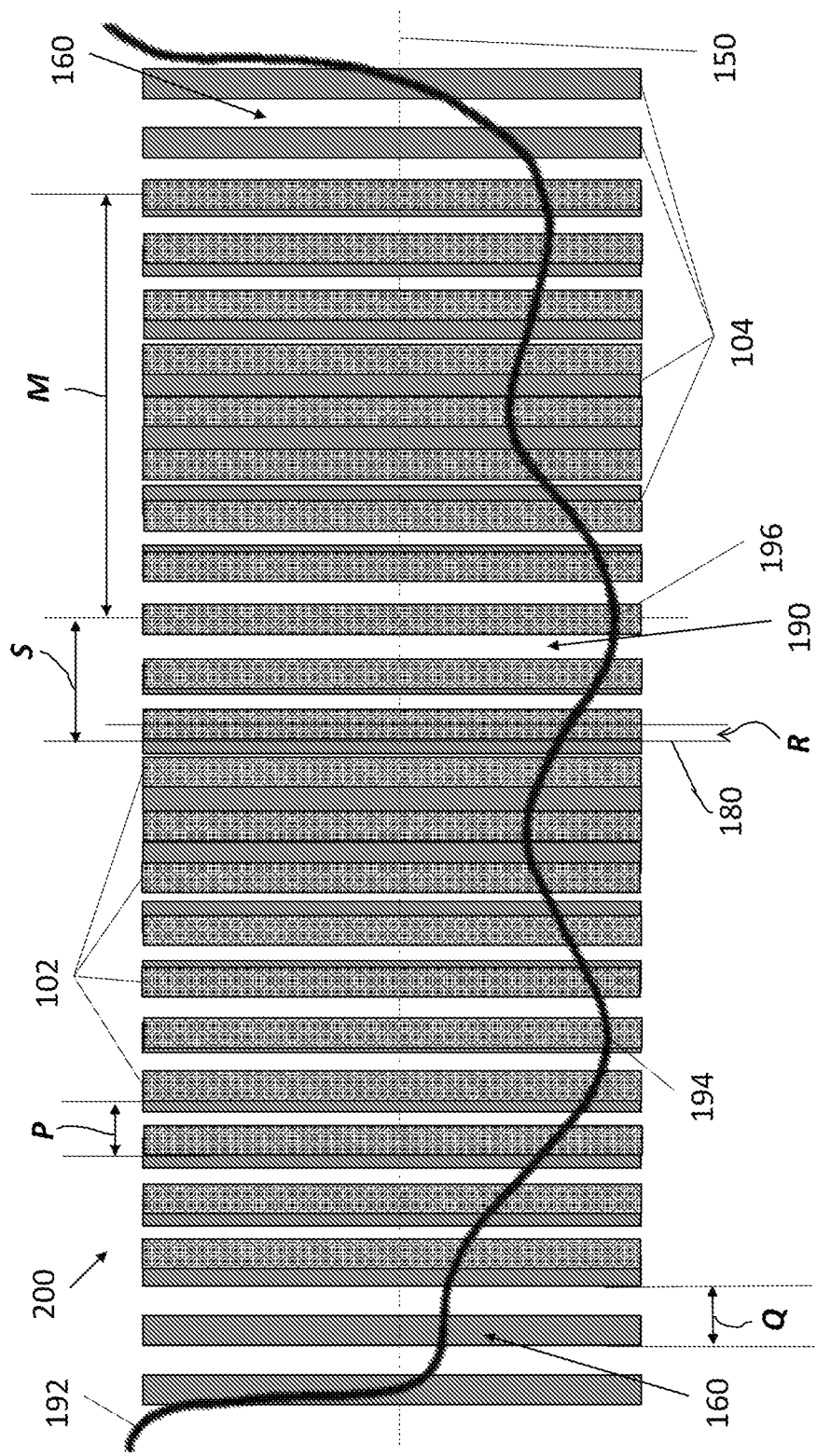
FIGS. 2A and 2B are simplified respective top view and sectional side view illustrations of the target of FIGS. 1A & 1B in a non-registration operative orientation.
Figure 2B:
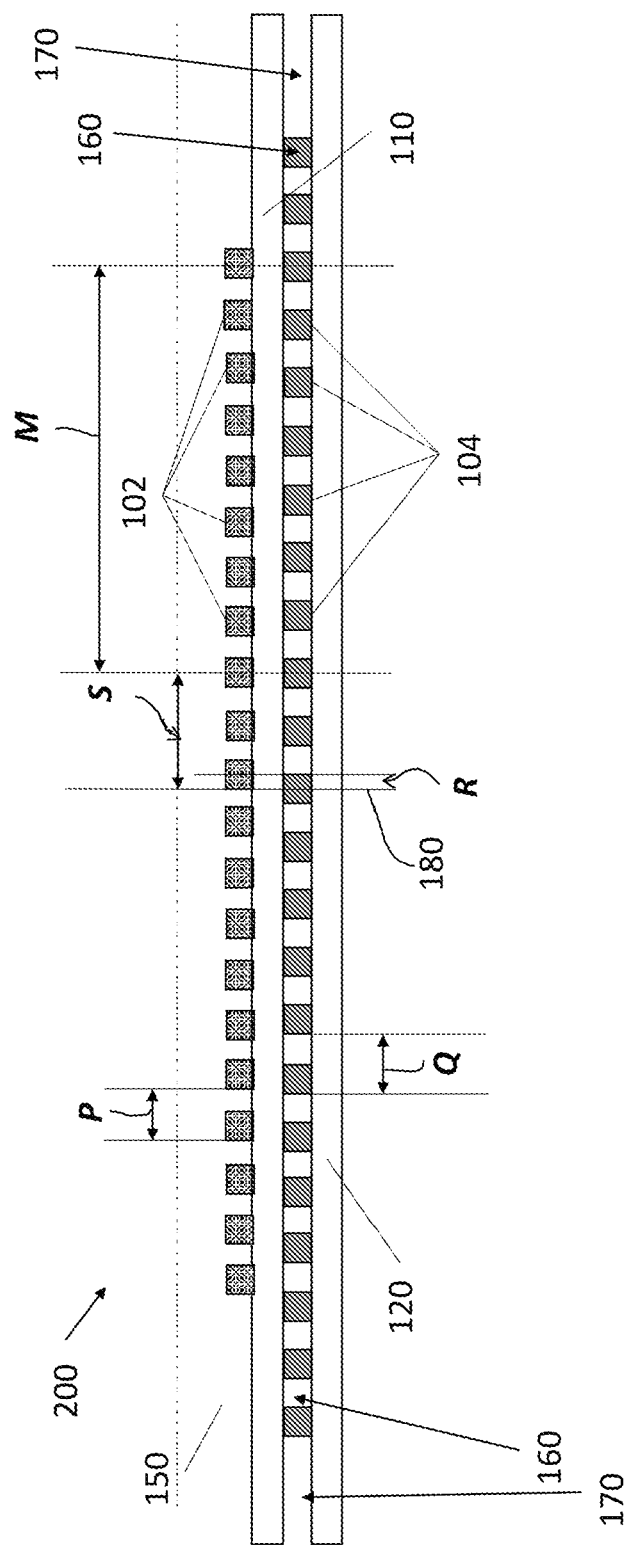

FIGS. 2A and 2B show the same target as shown in FIGS. 1A and 1B, here designated by reference numeral 200, including mutually overlaid first and second periodic structures 102 and 104, shown here as arrays of mutually parallel lines formed on first and second layers 110 and 120 respectively. Here, in contrast to that shown in FIGS. 1A & 1B, first and second periodic structures 102 and 104 are seen to be out of registration along axis 150 by an amount R, where R is up to 1000 nm, in either direction along axis 150.

As described hereinabove with reference to Eq. 1, misregistration between first and second periodic structures 102 and 104 along axis 150 by an amount R results in a larger corresponding shift S in the position of moiré pattern 190 relative to second periodic structure 104 along axis 150.

Specifically, shift S of moiré pattern 190 relative to second periodic structure 104 along axis 150, and more particularly the shift in the position of center of symmetry 196 of sinusoidal variation 194 representing moiré pattern 190 relative to center of symmetry 180 of second periodic structure 104 along axis 150, between the mutual operative orientation of registration shown in FIGS. 1A & 1B and the mutual operative orientation of non-registration shown in FIGS. 2A & 2B is greater than the relative shift R of the first and second periodic structures by a factor F, as defined hereinabove in equation 1. Thus, the relative position S of moiré pattern 190 is substantially easier to detect by an optical misregistration system than is the relative shift R. It is appreciated that signal 192, sinusoidal variation 194 and center of symmetry 196 are not drawn to scale.

It is appreciated that since targets 100 and 200 enable the measurement of misregistration of first and second layers 110 and 120 only along axis 150, multiple targets 100 and 200 are preferably formed on a single semiconductor device, with axis 150 for each target being formed for useful measurements of misregistration and are arranged with their periodic structures along other axes, which are preferably perpendicular to axis 150.

Turning additionally to FIG. 3, it is seen that first periodic structure 102, such as that formed on first layer 110 in FIGS. 1A-2B is defined by a plurality of mutually parallel lines 210 and a plurality of mutually parallel spaces 212 between mutually parallel lines 210 arranged along axis 150. Preferably lines 210 have a pitch P of 250-2000 nm, and more preferably of 250-650 nm, and a line width of 10%-90% of P, most typically 50% of P.

It is appreciated that lines 210 may be segmented, though they need not be. In an embodiment wherein lines 210 are segmented, as seen in enlargement A of FIG. 3, each one of lines 210 is defined by a plurality of sub-lines 214 and sub-spaces 216 between sub-lines 214. Preferably, the pitch of sub-lines 214 and sub-spaces 216 is the same as or close to the pitch of functional features on the semiconductor device on which targets 100 and 200 are printed. For example, a line 210 having a width of 420 nm may be formed of 15 sub-lines 214 and 15 sub-spaces 216 having a pitch U of 14 nm.

Figure 4:
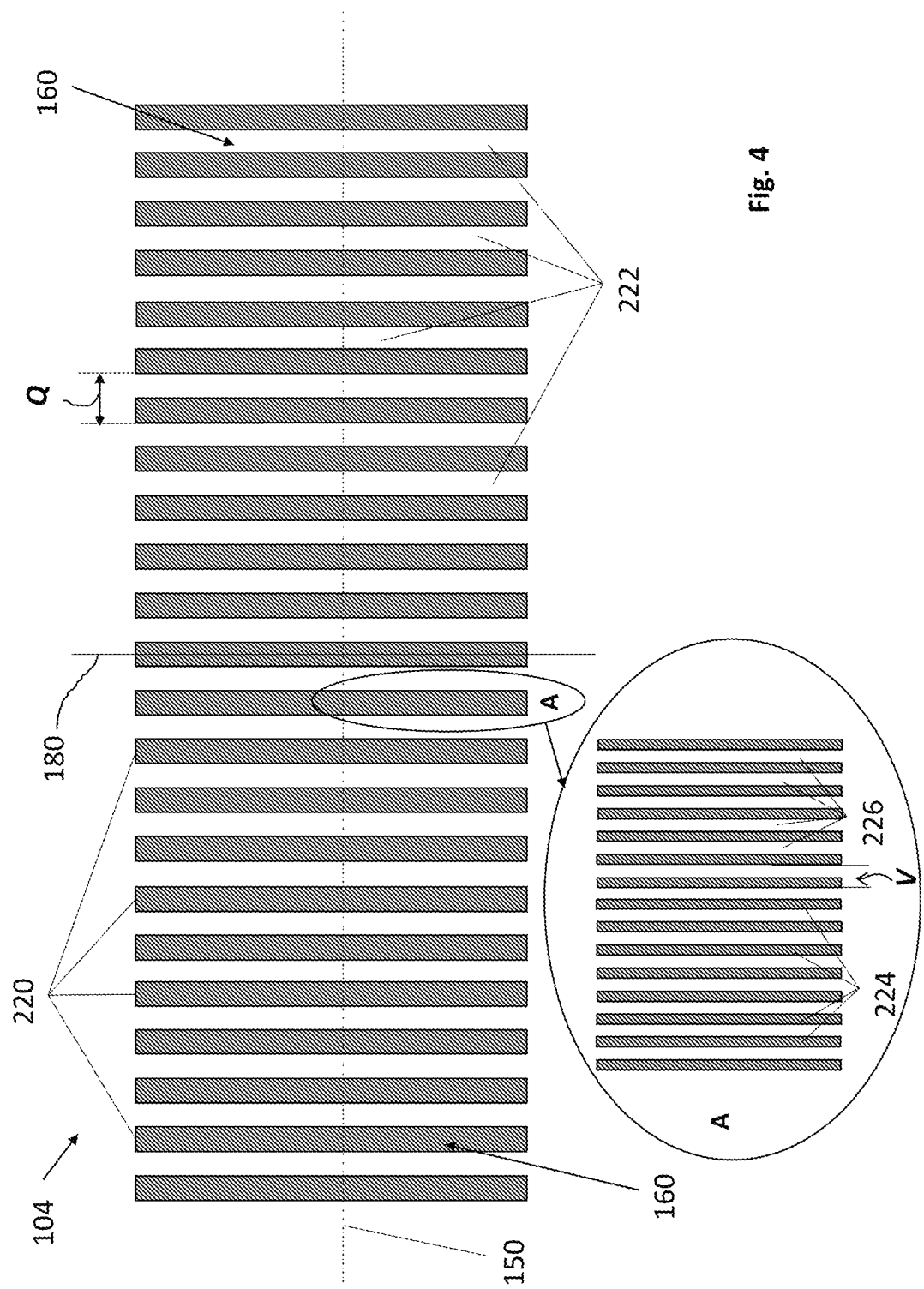
FIG. 4 is a simplified top view illustration of a second target layer, forming part of the target of FIGS. 1A-2B.

Turning additionally to FIG. 4, it is seen that second periodic structure 104, such as that formed on second layer 120 in FIGS. 1A-2B is defined by a plurality of mutually parallel lines 220 and a plurality of mutually parallel spaces 222 between mutually parallel lines 220 arranged along axis 150. Preferably lines 220 have a pitch Q of 250-2000 nm, and more preferably of 250-650 nm, and a line width of 10%-90% of Q, most typically 50% of Q.

It is appreciated that lines 220 may be segmented, though they need not be. In an embodiment wherein lines 220 are segmented, as seen in enlargement A of FIG. 4, each one of lines 220 is defined by a plurality of sub-lines 224 and sub-spaces 226 between sub-lines 224. Preferably, the pitch of sub-lines 224 and sub-spaces 226 is the same as or close to the pitch of functional features on the semiconductor device on which targets 100 and 200 are printed. For example, a line 220 having a width of 420 nm may be formed of 15 sub-lines 224 and 15 sub-spaces 226 having a pitch V of 14 nm.

In a preferred embodiment of the present invention, neither P nor Q is optically resolvable by a tool to optically measure misregistration, such as an Archer™ 600, commercially available from KLA-Tencor Corporation of Milpitas, Calif., USA. It is appreciated that P and Q are related to each other in such a way that pitch M of resulting moiré pattern 190, as defined hereinabove with reference to equation 2, is optically resolvable by the tool used to measure misregistration, preferably by pitch M being larger than the wavelength of light used to measure misregistration. In another embodiment of the present invention, P and Q are optically resolvable by the tool used to measure misregistration.

Figure 5:
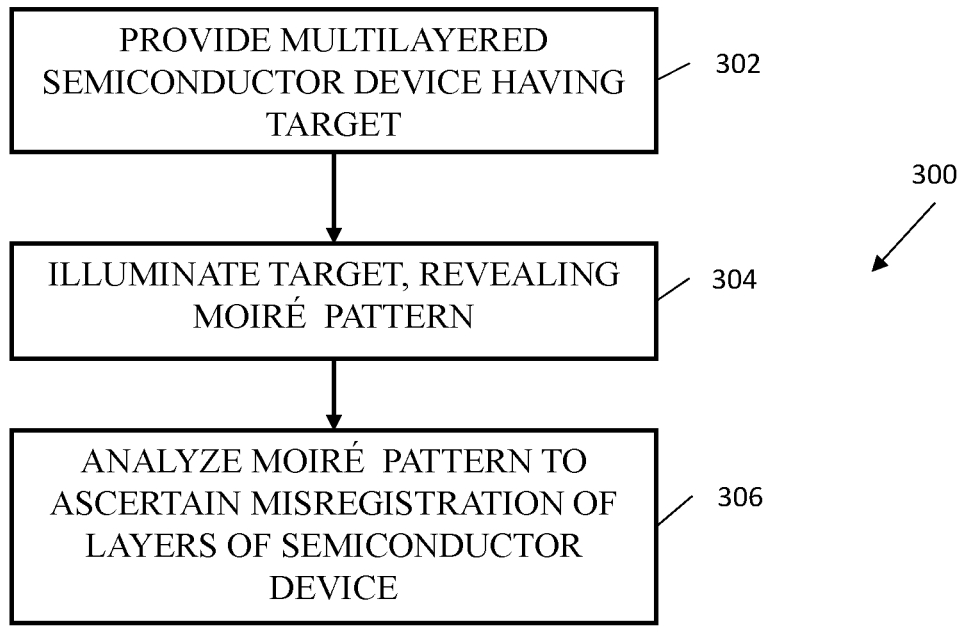
FIG. 5 is a simplified flowchart illustrating a method of measuring misregistration in the manufacture of semiconductor devices using the target of FIGS. 1A-4.

Reference is now made to FIG. 5, which is a simplified flowchart illustrating a method 300 of measuring misregistration in the manufacture of semiconductor devices using a target as described hereinabove with reference to FIGS. 1A-4 either in registered orientation of target 100 or in misregistered orientation of target 200. As seen at a first step 302, a multilayered semiconductor device is provided. The multilayered semiconductor device of step 302 includes at least one target 100 or target 200, as described hereinabove with reference to FIGS. 1-4.

As seen at a second step 304, a tool to optically measure misregistration, such as an Archer™ 600, commercially available from KLA-Tencor Corporation of Milpitas, Calif., USA, is used to illuminate target 100 or target 200 with light having at least one wavelength, resulting in moiré pattern 190. Typical light useful in measuring target 100 or target 200 has a wavelength between 400-850 nm, though it is appreciated that light of other wavelengths may also be used. At this stage, signal 192 is detected. It is appreciated that in the region of moiré pattern 190, signal 192 exhibits a sinusoidal variation 194 having a periodicity identical to pitch M of moiré pattern 190.

In a preferred embodiment of the present invention, the light used to measure misregistration in step 304 is polarized light. In some embodiments of the present invention, second periodic structure 104 and moiré pattern 190 are measured with different tool setups, including, inter alia, with different wavelengths of light. In a preferred embodiment of the present invention, the light used to measure misregistration in step 304 is characterized by a wavelength or wavelengths larger than pitches P and Q of target 100 or target 200. In an alternate embodiment of the present invention, the light used to measure misregistration in step 304 is characterized by a wavelength or wavelengths smaller than pitches P and Q of target 100 or target 200.

As seen at a next step 306, signal 192, including sinusoidal variation 194 having center of symmetry 196 due to moiré pattern 190, is analyzed. It is noted that in the case of registration described hereinabove with reference to FIGS. 1A and 1B, the center of symmetry 196 of sinusoidal variation 194 of signal 192 is located at the same position as center of symmetry 180 of second periodic structure 104. It is further noted that in the case of misregistration, as described hereinabove with reference to FIGS. 2A and 2B, the center of symmetry 196 of sinusoidal variation 194 representing moiré pattern 190 is located at a distance equal to F×R from center of symmetry 180 of second periodic structure 104, where F is the factor defined hereinabove in eq. 1 and R is relative shift R of the first and second periodic structures as described hereinabove with reference to FIGS. 2A and 2B.

Thus, at step 306, in the analysis of moiré pattern 190 to ascertain misregistration of first layer 110 and second layer 120 along axis 150, a comparison is made between the location of center of symmetry 180 of second periodic structure 104 and the location of center of symmetry 196 of sinusoidal variation 194 of signal 192, and misregistration between first and second layers 110 and 120 of the semiconductor device of step 302 is ascertained from the difference in the locations between center of symmetry 180 and center of symmetry 196.

For example, in a case wherein first periodic structure has a pitch P of 350 nm, second periodic structure has a pitch Q of 400 nm, and misregistration R is 1 nm, the change in relative position of center of symmetry 196 of sinusoidal variation 194 of signal 192 along axis 150 is 8 nm.

In an additional example, in a case wherein first periodic structure has a pitch P of 312 nm, second periodic structure has a pitch Q of 260 nm, and misregistration R is 4 nm, the change in relative position center of symmetry 196 of sinusoidal variation 194 of signal 192 along axis 150 is 20 nm.

In a further example, in a case wherein first periodic structure has a pitch P of 500 nm, second periodic structure has a pitch Q of 550 nm, and misregistration R is 2 nm, the change in relative position of center of symmetry 196 of sinusoidal variation 194 of signal 192 along axis 150 is 22 nm.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A target for use in optical measurement of misregistration in the manufacture of semiconductor devices, the target comprising:
   a first periodic structure formed on a first layer of a semiconductor device and having a first pitch along an axis; and
   a second periodic structure formed on a second layer of said semiconductor device and having a second pitch along said axis, different from said first pitch, said second periodic structure extending beyond said first periodic structure along said axis in two opposite directions by at least a distance of twice the second pitch.

2. A target according to claim 1, wherein said first pitch and said second pitch are each smaller than 2000 nm.

3. A target according to claim 1, wherein said first pitch and said second pitch are each smaller than 650 nm.

4. A target according to claim 1, wherein said first and second pitches are such that when said target is illuminated by light of at least one wavelength there results a moiré pattern having a third pitch, said third pitch being larger than said at least one wavelength.

5. A target according to claim 1, wherein said target has an area smaller than 50 μm×50 μm.

6. A target according to claim 1, wherein said target has an area smaller than 4 μm×4 μm.

7. A target according to claim 1, wherein said target has an area smaller than 2 μm×2 μm.

8. A target according to claim 1, wherein said target is rectangular in shape.

9. A target according to claim 1, wherein said first periodic structure is defined by lines and spaces between said lines, said lines and said spaces between said lines each having a width equal to 50% of said first pitch.

10. A target according to claim 1, wherein said first periodic structure is defined by lines and spaces between said lines, said lines each having a width of 10% 90% of said first pitch.

11. A target according to claim 9, wherein each of said lines of said first periodic structure is defined by a plurality of sub-lines and sub-spaces between said sub-lines, wherein said sub-lines and sub-spaces between said sub-lines of said first periodic structure have a pitch of approximately 12 nm 50 nm.

12. A target according to claim 1, wherein said second periodic structure is defined by lines and spaces between said lines, said lines and said spaces between said lines each having a width equal to 50% of said second pitch.

13. A target according to claim 1, wherein said second periodic structure is defined by lines and spaces between said lines, said lines each having a width of 10%-90% of said second pitch.

14. A target according to claim 12, wherein each of said lines of said second periodic structure is defined by a plurality of sub-lines and sub-spaces between said sub-lines, wherein said sub-lines and sub-spaces between said sub-lines of said second periodic structure have a pitch of approximately 12 nm-50 nm.

15. A method of measuring misregistration in the manufacture of semiconductor devices comprising:
   providing a multilayered semiconductor device comprising at least a first layer and a second layer, wherein said device comprises a target comprising:
   a first periodic structure formed on said first layer and having a first pitch along an axis; and a second periodic structure formed on said second layer and having a second pitch along said axis, different from said first pitch, said second periodic structure extending beyond said first periodic structure in two opposite directions along said axis by at least a distance of twice the second pitch;

illuminating said target with light of at least one wavelength, resulting in a moiré pattern characterized by a third pitch; and performing analysis of said moiré pattern to ascertain misregistration of said first layer and said second layer along said axis.

16. A method of measuring misregistration in the manufacture of semiconductor devices according to claim 15, wherein said first pitch and said second pitch are each smaller than said at least one wavelength.

17. A method of measuring misregistration in the manufacture of semiconductor devices according to claim 15, wherein said third pitch is larger than said at least one wavelength.

18. A method of measuring misregistration in the manufacture of semiconductor devices according to claim 15, wherein said first pitch and said second pitch are each larger than said at least one wavelength.

19. A method of measuring misregistration in the manufacture of semiconductor devices according to claim 15, wherein said first periodic structure is defined by lines and spaces between said lines, said lines and said spaces between said lines of said first periodic structure each having a width equal to 50% of said first pitch.

20. A method of measuring misregistration in the manufacture of semiconductor devices according to claim 15, wherein said first periodic structure is defined by lines and spaces between said lines, said lines of said first periodic structure each having a width of 10%-90% of said first pitch.

21. A method of measuring misregistration in the manufacture of semiconductor devices according to claim 19, wherein each of said lines of said first periodic structure is defined by a plurality of sub-lines and sub-spaces between said sub-lines, wherein said sub-lines and sub-spaces between said sub-lines of said first periodic structure have a pitch of approximately 12 nm-50 nm.

22. A method of measuring misregistration in the manufacture of semiconductor devices according to claim 15, wherein said second periodic structure is defined by lines and spaces between said lines, said lines and said spaces between said lines of said second periodic structure each having a width equal to 50% of said second pitch.

23. A method of measuring misregistration in the manufacture of semiconductor devices according to claim 15, wherein said second periodic structure is defined by lines and spaces between said lines, said lines of said second periodic structure each having a width of 10%-90% of said second pitch.

24. A method of measuring misregistration in the manufacture of semiconductor devices according to claim 22, wherein each of said lines of said second periodic structure is defined by a plurality of sub-lines and sub-spaces between said sub-lines, wherein said sub-lines and sub-spaces between said sub-lines of said second periodic structure have a pitch of approximately 12 nm-50 nm.

25. A method of measuring misregistration in the manufacture of semiconductor devices according to claim 15, wherein:

said second periodic structure is characterized by a first center of symmetry;

said illuminating of said target results in a signal from said target, said signal comprising a sinusoidal variation due to said moiré pattern, said sinusoidal variation characterized by a second center of symmetry; and said analysis of said moiré pattern to ascertain said misregistration of said first layer and said second layer along said axis comprises comparison of locations of said first center of symmetry and said second center of symmetry.

\* \* \* \* \*